(12) United States Patent
Chen

(10) Patent No.: US 9,853,628 B1
(45) Date of Patent: Dec. 26, 2017

(54) STRUCTURE OF AN INTEGRATED CRYSTAL OSCILLATOR PACKAGE

(71) Applicant: DAPA INC., Taoyuan (TW)

(72) Inventor: Ting-Yi Chen, Taoyuan (TW)

(73) Assignee: Dapa Inc., Taoyuan (TW)

( * ) Notice: Subject to any disclaimer, the term of this patent is extended or adjusted under 35 U.S.C. 154(b) by 0 days.

(21) Appl. No.: 15/281,916

(22) Filed: Sep. 30, 2016

(30) Foreign Application Priority Data

Aug. 17, 2016 (TW) .............................. 105126284 A

(51) Int. Cl.
| | |
|---|---|
| *H03B 5/32* | (2006.01) |
| *H03H 9/19* | (2006.01) |
| *H01L 41/053* | (2006.01) |
| *H01L 41/047* | (2006.01) |
| *H01L 41/107* | (2006.01) |
| *H01L 41/18* | (2006.01) |

(52) U.S. Cl.
CPC ............. *H03H 9/19* (2013.01); *H01L 41/047* (2013.01); *H01L 41/0533* (2013.01); *H01L 41/107* (2013.01); *H01L 41/18* (2013.01); *H03B 5/32* (2013.01)

(58) Field of Classification Search
CPC ... H01L 41/197; H01L 41/0533; H01L 41/18; H01L 41/107; H01L 41/047; H03B 5/32; H03H 9/19
USPC .................................. 331/116 FE, 158, 68, 2
See application file for complete search history.

(56) References Cited

U.S. PATENT DOCUMENTS

| | | | |
|---|---|---|---|
| 2015/0116052 A1* | 4/2015 | Kikushima | .......... H03H 9/0552 331/158 |
| 2015/0280101 A1* | 10/2015 | Kondo | ................ H01L 41/0533 331/158 |
| 2017/0230003 A1* | 8/2017 | Kikuchi | ................... H03B 5/32 |

* cited by examiner

*Primary Examiner* — Arnold Kinkead
(74) *Attorney, Agent, or Firm* — Rosenberg, Klein & Lee

(57) ABSTRACT

A structure of an integrated crystal oscillator package has a first quartz crystal resonator, a second quartz crystal resonator, and application-specific integrated circuit chip (ASIC) combined in a package. The ASIC has a switch control for receiving audio formats of 44.1 kHz and 48 kHz with different hi-fidelity (hi-fi). The first quartz crystal resonator has a first clock rate corresponding to the 44.1 kHz frequency and the second quartz crystal resonator has a second clock rate corresponding to the 48 kHz frequency to be switched by the present invention in operation.

8 Claims, 9 Drawing Sheets

STRUCTURE OF AN INTEGRATED CRYSTAL OSCILLATOR PACKAGE

BACKGROUND OF THE INVENTION

1. Field of the Invention

The present invention relates to a structure of an integrated crystal oscillator package that has a first quartz crystal resonator, a second quartz crystal resonator, and an application-specific integrated circuit chip combined in a package.

2. Description of the Related Art

Music players have been an important portion in smartphones. Some manufacturers even install an acoustic module from high-end players onto smartphones for better hi-fidelity (hi-fi) of the music. Such acoustic module has a quartz crystal resonator therein and a circuit designed to make use of the oscillation frequencies produced by piezoelectric effects to enhance the oscillation frequency of the quartz crystal resonator. Operations of such crystal oscillator package can be further divided into crystal resonator and crystal oscillator structures.

FIG. 1A discloses a structure of a conventional crystal resonator package 10 which has a substrate 11, a crystal resonator 12 mounted on the substrate 11 by silver glues 13, and a cover 14 placed on the substrate 11. Then referring to FIG. 1B, two crystal resonators 10 are separately mounted on a PCB P of a smartphone to be operated by an integrated circuit (IC) thereon—to individually output a first clock rate and a second clock rate. Such structure is able to save the costs for parts in the manufacturing process and has a fair covering area on the smartphone and a fair integration of the different clock rates. However, the structure is unable to hold control of the phase noises produced in the process.

FIG. 1C discloses another structure of a conventional crystal oscillator package 20 that has a substrate 21 with a staircase depression 211 and a stair surface 212, an application-specific integrated circuit chip (ASIC) 22 disposed on the depression 211, a crystal resonator 23 mounted on the stair surface 212 by silver glues 24, and a cover 25 covered on the substrate 21. FIG. 1D illustrates two of the crystal oscillators 20 mounted on a PCB P of a smartphone, each of which outputting a clock rate for operation.

In FIG. 1E, a structure of another crystal oscillator package 30 is illustrated, including a substrate 31 with a first depression 311 thereon and a second depression 312 thereunder, a crystal resonator 32 mounted on the first depression 311 by silver glues 33, and an application-specific integrated circuit chip (ASIC) 34 disposed on the second depression 312, and a cover 35 placed above the first depression 311. FIG. 1F further shows two of the crystal oscillator packages 30 mounted on a PCB P of a smartphone, each of which outputting a clock rate for operation.

The crystal oscillator package 20 and the crystal oscillator package 30 both are able to hold control of the phase noises and requires a fair area on a smartphone for installation; also, their integration function is satisfying. However, such structures require higher costs for parts in the manufacturing process.

FIG. 1G shows a conventional codec C used for audio system on smartphones mentioned on the official website of Xiaomi Inc. (http://www.mi.com/minote/hifi/). It consumes lower costs but functions poorly in the phase noise performance. Then there is a hi-fidelity (hi-fi) system F developed to present much lower noises for better audio quality of the music as shown in FIG. 1H, which was also mentioned on the website of Meizu Telecom Equipment Co., Ltd (http://www.meizu.com/products/mx4pro/hifi.html). The hi-fi system F has two crystal oscillators 20, 30 combined with an isolated audio chip F1, an isolated amplifier F2, and other essential elements F3 to achieve the purpose of better audio quality for music with low phase noises from the two independent crystal oscillators 20, 30. Such structure has the installed PCB P setting up a CD sampling frequency as 44.1 kHz and a DVD sampling frequency as 48 kHz to process different audio formats. For further illustration, please see the chart below.

| | An audio format multiplied by 44.1 kHz corresponding to one of the crystal oscillators | An audio format multiplied by 48 kHz corresponding to the other of the crystal oscillators |
| --- | --- | --- |
| 512 times | 22.5792 MHz | 24.576 MHz |
| 1024 times | 45.1584 MHz | 49.152 MHz |
| 2048 times | 90.3168 MHz | 98.304 MHz |

From the chart we can learn that the frequencies multiplied by the sampling frequencies can also apply to the structures.

On the other hand, as shown in FIG. 1I, the hi-fi system F requires two crystal oscillators; that is, each system needs connecting points for two isolated electricity power suppliers VDD, two ground connections GND, two signal input controllers INH, and two connecting points F out for frequency output. The input frequency of the system has to be switched between the signal input controllers INH for operation. In other words, such structure is not integrated.

FIG. 1J is disclosed in Japanese Patent No. 3770607. There is an integrated downsized crystal resonator package 40, including an insulating substrate 41 having an oblong depression 411, a first stair surface 412, and a second stair surface 413, a first electrode pad 42 disposed on the first and second stair surfaces 412, 413, a second electrode pad 43 disposed on the first and second stair surfaces 412, 413, a wiring conductor 44 arranged under the substrate 41 and electrically connected to the first and second electrode pads 42, 43, and a cover 45 disposed on the substrate 41. The crystal resonator package 40 thereby has a first crystal resonator 47A and a second crystal resonator 47B respectively mounted on the first and second electrode pads 42, 43 by a conductive adhesives 46. The package volume is therefore downsized.

FIG. 1L shows another downsized crystal resonator package 50 with airtight sealing disclosed in Japanese Patent No. 5882868. The package includes an insulating substrate 51 with a first depression 511 thereon connecting a second depression 512 thereunder via a through hole 513, a first wiring conductor 52 disposed in the first depression 511, a second wiring conductor 53 disposed in the second depression 512, a second crystal resonator 54B bonded to the second wiring conductor 53 by a bonding material 55, a second cover 56 sealing the second depression 512, a first crystal resonator 54A bonded to the first wiring conductor 52 by the bonding material 55, and a first cover 57 sealing the first depression 511. The first and second depressions 511, 512 are vacuumed via the through hole 513 to be airtight. The package volume is therefore downsized as well.

The package structures disclosed above mention nothing about hi-fi systems for musics. However, if they are applied to be mounted on a PCB for outputting different clock rates, there is still a problem of phase noises control.

All in all, the question is how to sustain a structure with two crystal oscillators that satisfies requirement of hi-fi system with low phase noises and meanwhile keeps the features of less volume and better integration; also, the costs for parts is another subject to be improved.

SUMMARY OF THE INVENTION

A primary object of the present invention is to provide an integrated crystal oscillator package that holds control of phase noises to satisfy a hi-fi quality, keeps features of less area for installation of a circuit on smartphones and integration of different frequencies output from different clock rates, and reduces costs for parts in the manufacturing process.

To achieve the objects mentioned above, the present invention comprises a substrate having a first depression thereon and a second depression at a bottom thereof, said first depression having a first stair surface with a first conductive section and a second stair surface with a second conductive section, and said second depression having a third conductive section; a first quartz crystal resonator having an end thereof fixed on the first conductive section; a second quartz crystal resonator having an end thereof fixed on the second conductive section; a cover disposed on the first depression for sealing the first and second quartz crystal resonators therein; and an application-specific integrated circuit chip (ASIC) coupled to the third conductive section, said third conductive section further separately connected to the first and second conductive sections; whereby the ASIC has a switch control for operation when receiving audio formats with different degree of hi-fidelity (hi-fi) corresponding to a first clock rate output from the first quartz crystal resonator or to a second clock rate output from the second quartz crystal resonator.

Furthermore, frequencies of 44.1 kHz and a multiple thereof are corresponding to the first clock rate, and frequencies of 48 kHz and a multiple thereof are corresponding to the second clock rate. The first and second quartz crystal resonators have either the same sides or opposite sides fixed on the first and second conductive sections.

The substrate is a ceramic substrate or a PCB to have electric wires arranged therein separately connecting the third conductive section with the first and second conductive sections for the switch control to operate. The substrate further has a first bond pad group and a second bond pad group at a bottom thereof, said first and second bond pad groups individually coupled to the ASIC via the electric wires for the present invention to form a surface mount device (SMD).

The switch control has a first switch and a second switch to switch between a first sampling frequency output and a second sampling frequency output, or to simultaneously output both frequencies.

With structures disclosed above, the present invention has the first quartz crystal resonator, the second quartz crystal resonator, and the ASIC combined in a package to form an integrated package structure that includes two isolated circuits and an isolated ASIC, so as to control the phase noises to achieve requirements of the hi-fi system and to ensure the package uses a minimum area on a smartphone with the feature of integration of different clock rates. In addition, the present invention consumes lower costs for parts in the manufacturing process.

DETAILED DESCRIPTION OF THE PREFERRED EMBODIMENT

Figure 1A:
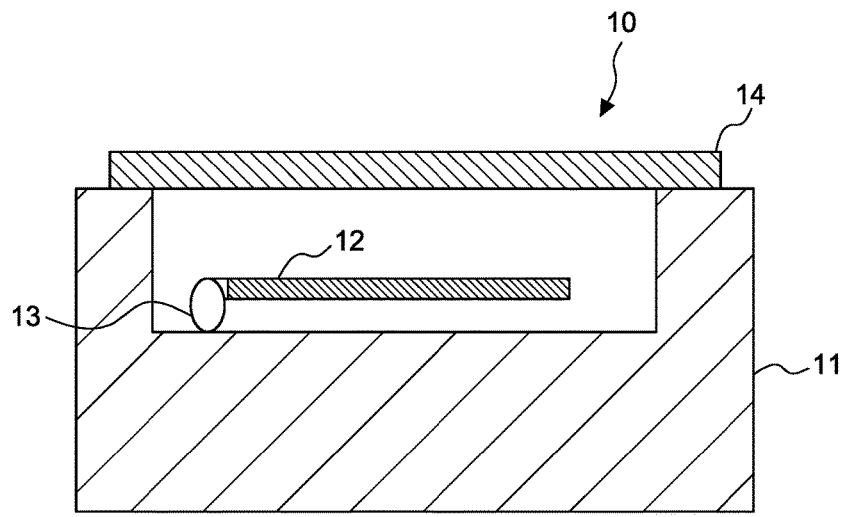
FIG. 1A is a schematic diagram illustrating a structure of a conventional crystal resonator.

Referring to FIGS. 2-6B, in a preferred embodiment, an integrated crystal oscillator package 60 comprises a substrate 70, a first quartz crystal resonator 80A, a second quartz crystal resonator 80B, a cover 75, and an application-specific integrated circuit chip (ASIC) 90.

The substrate 70 includes a first depression 71 arranged thereon and a second depression 74 arranged at a bottom thereof. The first depression 71 further has a first stair surface 72 with a first conductive section 721 and a second stair surface 73 with a second conductive section 731; the second depression 74 further has a third conductive section 741 therein. In this embodiment, the substrate 70 is a ceramic substrate or a PCB to have electric wires (not shown) arranged therein, and the first, second, and third conductive sections 721, 731, 741 have a plurality of connecting points.

The first quartz crystal resonator 80A has an end thereof fixed on the first conductive section 721 on the first stair surface 72, and the second quartz crystal resonator 80B has an end thereof fixed on the second conductive section 731 on the second stair surface 73. The cover 75 is disposed on the first depression 71 for sealing the first and second quartz crystal resonators 80A, 80B therein.

Figure 3:
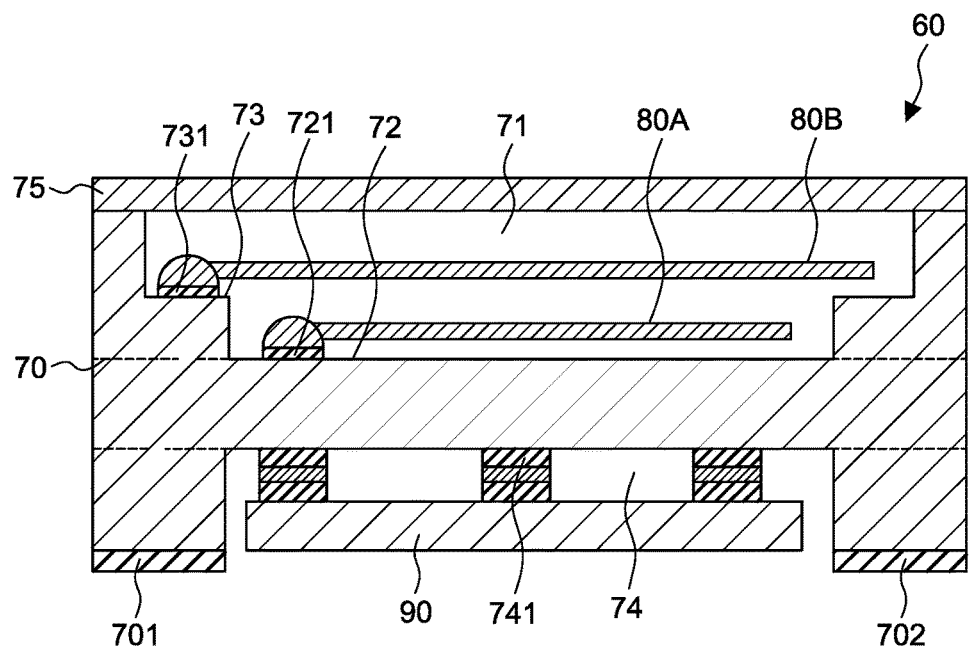
FIG. 3 is a sectional view along line 3-3 in FIG. 2.
Figure 4:
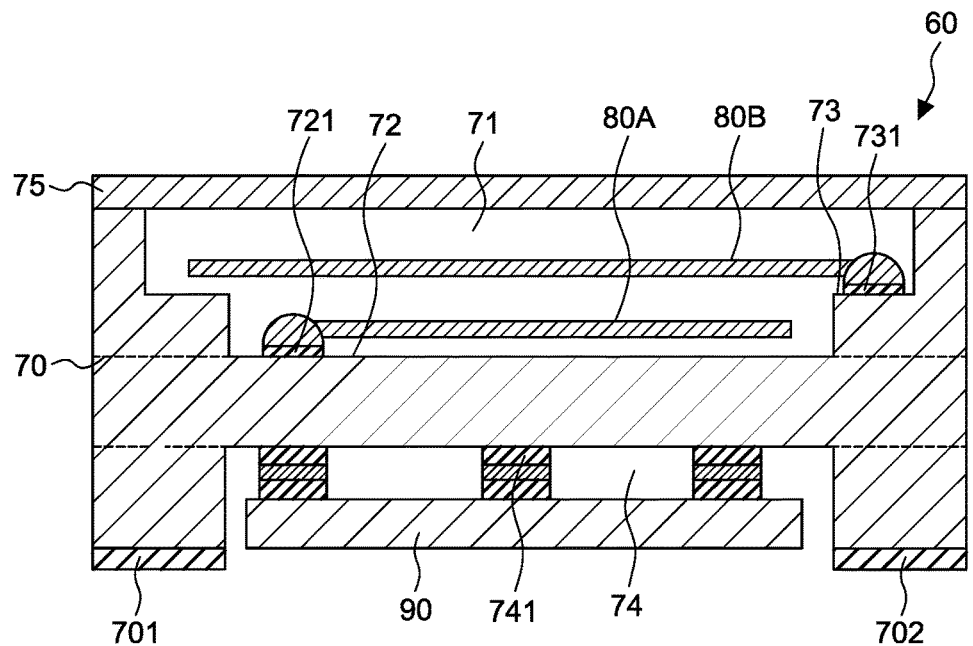
FIG. 4 is another sectional view of the present invention.

Referring to FIGS. 3 and 4, in this embodiment, the first and second quartz crystal resonators 80A, 80B may have their fixed ends either on the same sides or at opposite sides. Furthermore, the first and second quartz crystal resonators 80A, 80B are respectively coupled to the first and second conductive sections 721, 731 via the connecting points thereof, and the substrate 70 and the cover 75 have the first and second quartz crystal resonators 80A, 80B airtight sealed therein.

The ASIC 90 is coupled to the third conductive section 741 which is further separately connected to the first and second conductive sections 721, 731. In this embodiment, the ASIC 90 is coupled to the connecting points of the third conductive section 741 and has the electric wires arranged therein to connect the third conductive section 741 with the first and second conductive sections 721, 731 for the ASIC 90 to be separately connected to the first quartz crystal resonator 80A and the second quartz crystal resonator 80B. In addition, the substrate 70 further has a first bond pad group 701 and a second bond pad group 702 at a bottom thereof, and the first and second bond pad groups 701, 702 are individually coupled to the ASIC 90 via the electric wires for the present invention to become a surface mount device (SMD).

Figure 5:
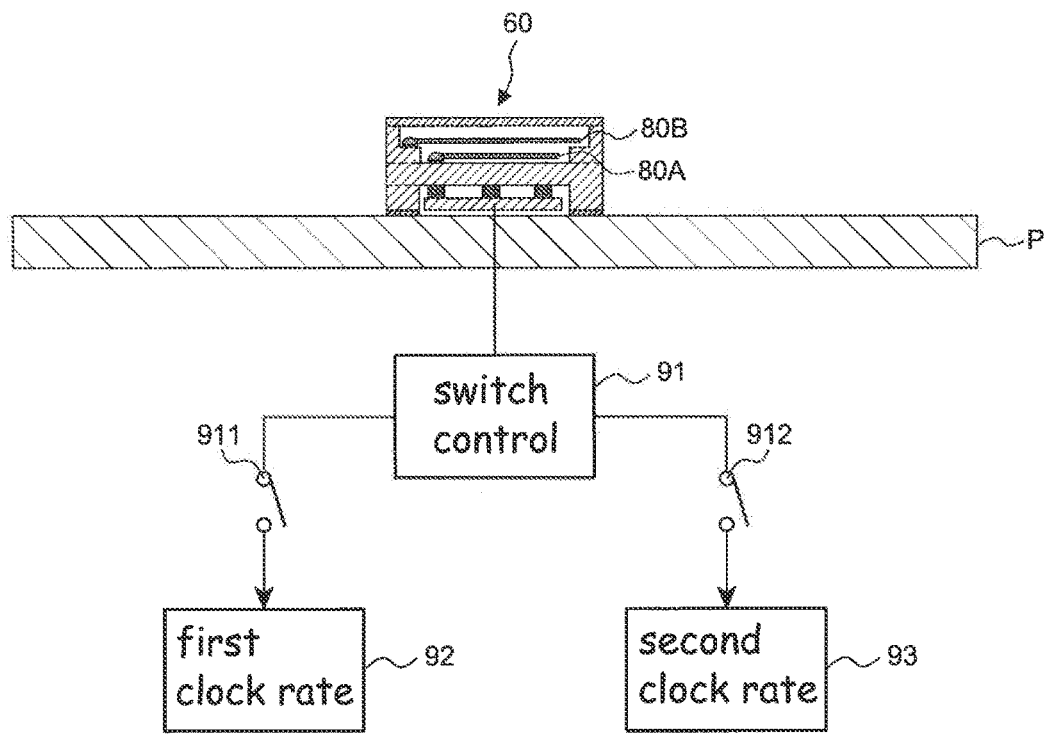
FIG. 5 is a schematic diagram illustrating the present invention mounted on a PCB.

In FIG. 5, the integrated oscillator package 60 is mounted on a PCB P of a smartphone. In this application, the ASIC 90 has a switch control 91 to switch between different audio formats with different degree of hi-fidelity (hi-fi) to individually corresponds to a first clock rate 92 output from the first quartz crystal resonator 80A and to a second clock rate 93 output from the second quartz crystal resonator 80B, so as to form a structure of an integrated crystal oscillator package. In this embodiment, the switch control 91 has a first switch 911 and a second switch 912 to switch between the first clock rate 92 and the second clock rate 93 for output, or to simultaneously output both frequencies.

Figure 6A:
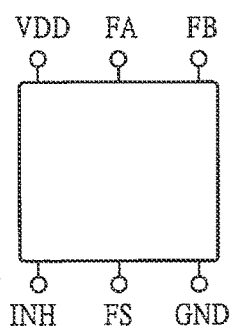
FIG. 6A is a circuit diagram of the present invention.
Figure 6B:
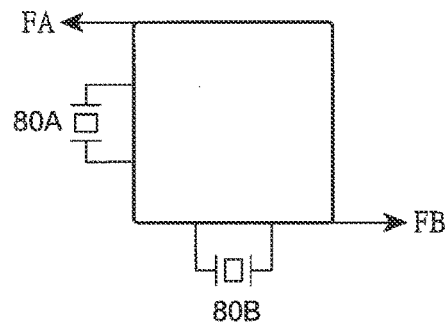
FIG. 6B is an application example of the present invention.

FIG. 6A illustrates a circuit diagram of the present invention. Normally a hi-fi system requires two crystal oscillators; in other words, there are isolated connecting points for two electricity power suppliers VDD, two ground connections GND, two signal input controllers INH, and two frequency outputs F. However, in the present invention the crystal oscillators are integrated into one single package which only requires connecting points for one electricity power supplier VDD, one ground connection GND, one signal input controller INH, one first clock rate output FA, one second clock rate output FB, and one switch transmission input FS. That is, the present invention is highly integrated to have two crystal oscillators and one ASIC within one package. In this embodiment, the audio formats are 44.1 kHz and 48 kHz. The first clock rate 92 outputs a 44.1 kHz frequency and the second clock rate 93 outputs a 48 kHz frequency. Further referring to FIG. 6B, the first and second crystal quartz resonators 80A, 80B can individually output the frequency or simultaneously output both frequencies in operation; the first clock rate 92 outputs a frequency of 44.1 kHz or a multiple thereof, and the second clock rate 93 outputs a frequency of 48 kHz or a multiple thereof.

To further elaborate features of the present invention, please see the following chart for comparison.

Figure 1B:
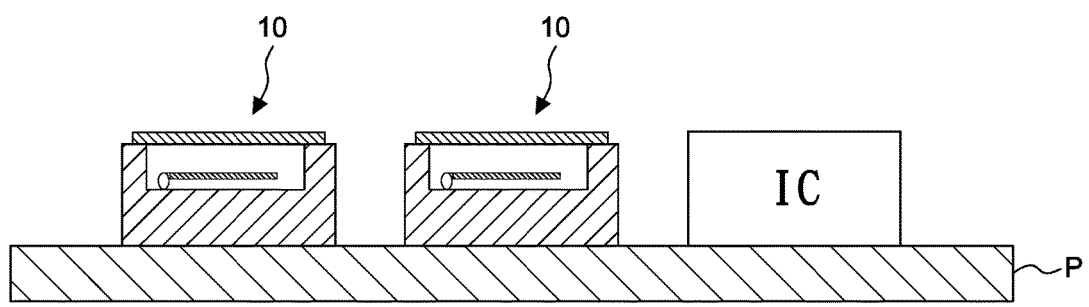
FIG. 1B is a schematic view of two conventional crystal resonators mounted on a PCB.
Figure 1C:
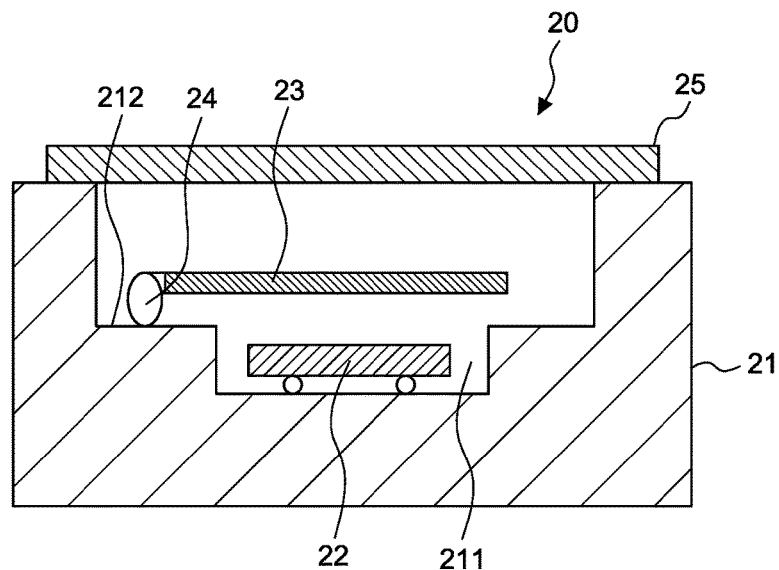
FIG. 1C is a schematic diagram illustrating a structure of a conventional crystal oscillator.
Figure 1D:
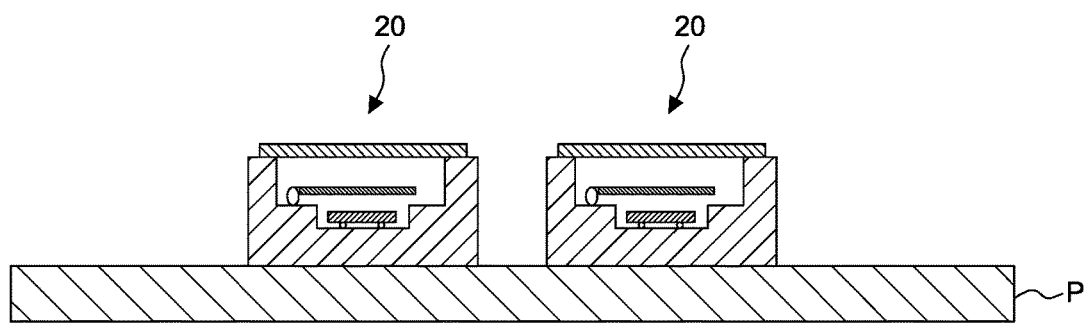
FIG. 1D is a schematic view of two conventional crystal oscillators mounted on a PCB.
Figure 1E:
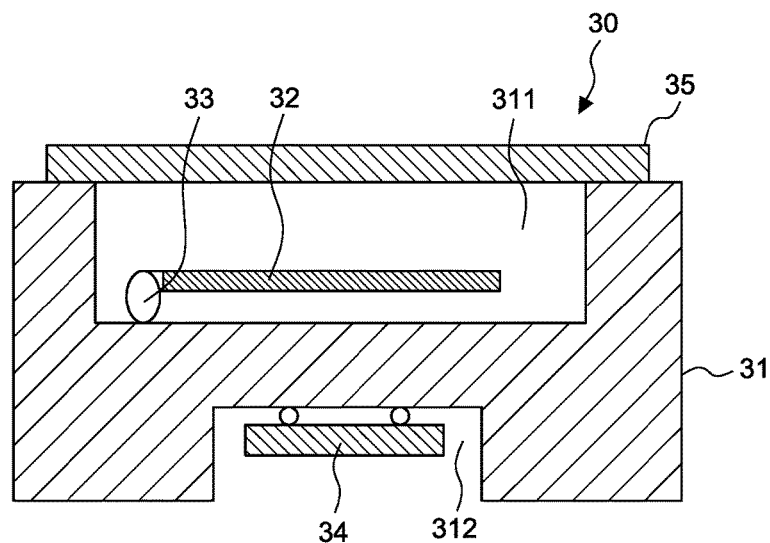
FIG. 1E is a schematic diagram illustrating a structure of another conventional crystal oscillator.
Figure 1F:
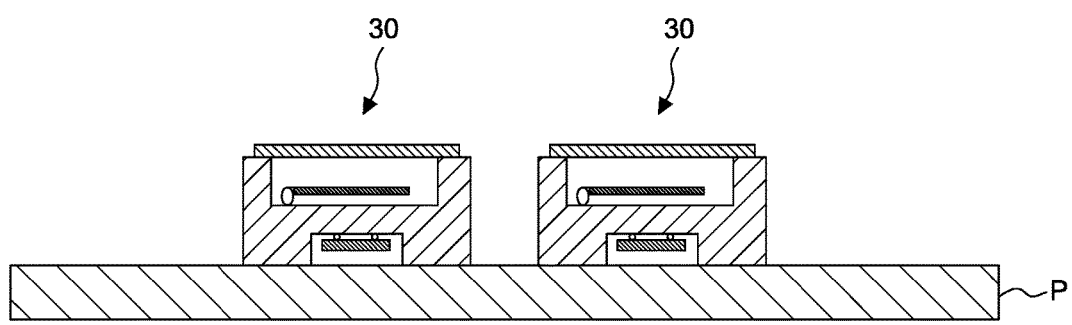
FIG. 1F is a schematic view of two conventional crystal oscillators in FIG. 1E mounted on a PCB.
Figure 1G:
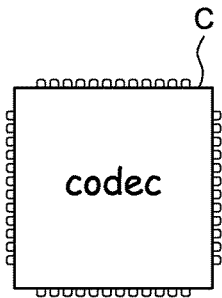
FIG. 1G is a schematic view of a conventional codec.
Figure 1H:
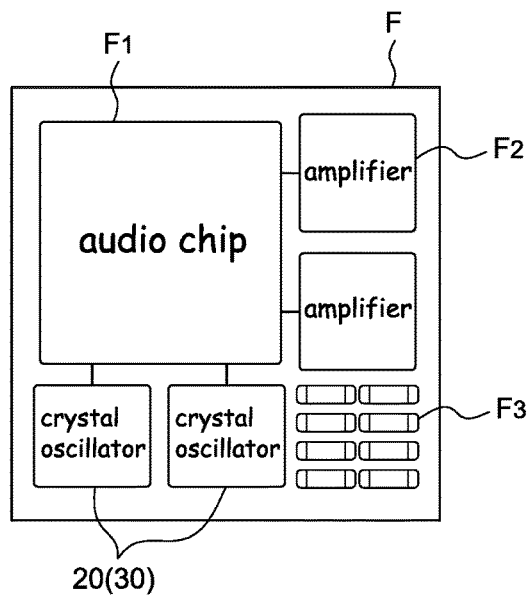
FIG. 1H is a schematic view of a conventional high-fidelity (hi-fi) system.
Figure 1I:
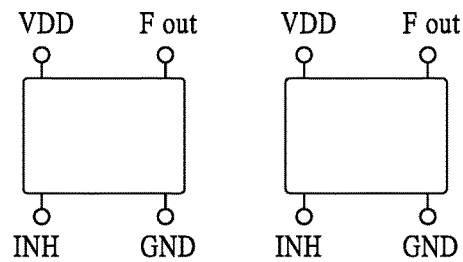
FIG. 1I is a schematic view of a conventional hi-fi system with a package of two crystal resonators.
Figure 1J:
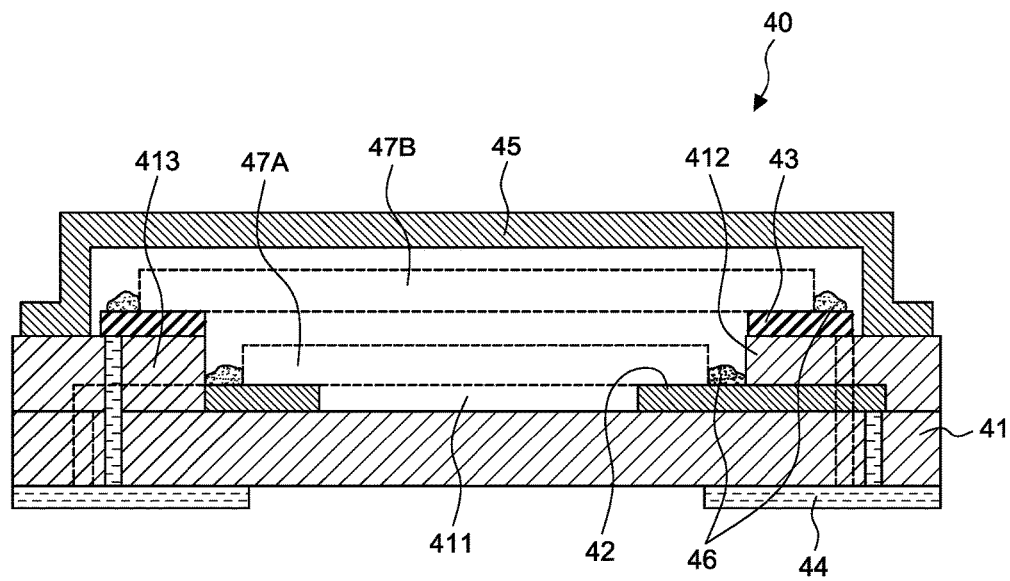
FIG. 1J is a schematic diagram illustrating a structure of a downsized crystal resonator package according to the prior art.
Figure 1K:
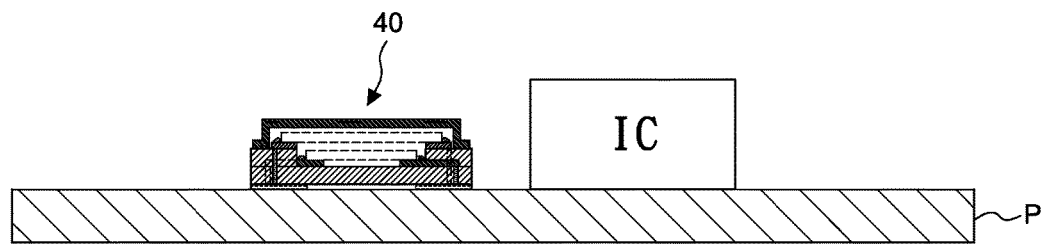
FIG. 1K is a schematic diagram showing the downsized crystal resonator package mounted on a PCB.
Figure 1L:
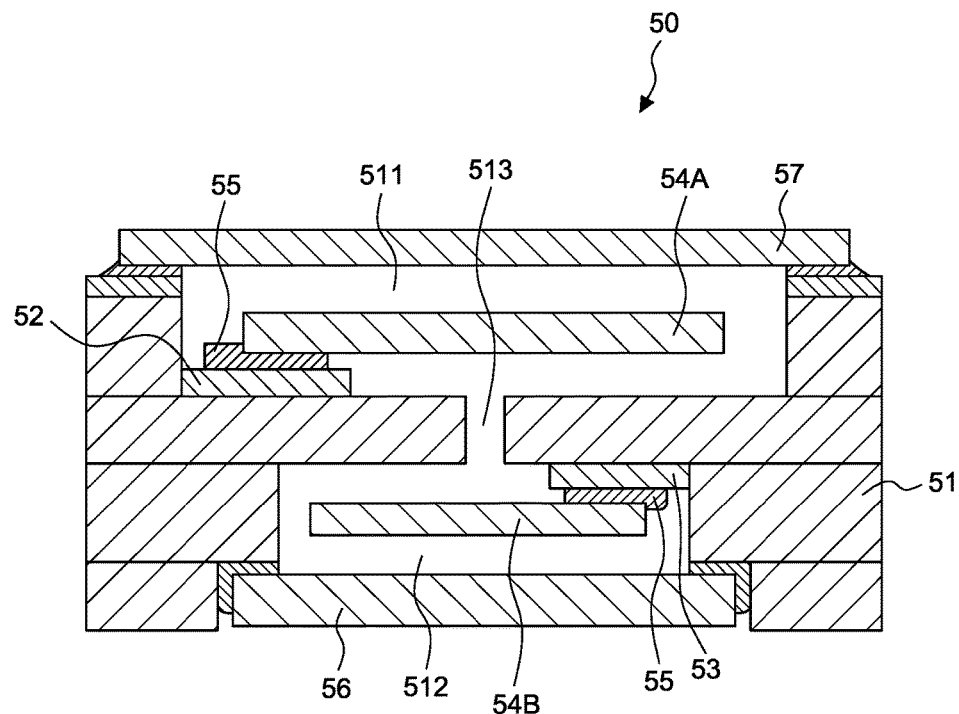
FIG. 1L is a schematic diagram illustrating a structure of a downsized crystal resonator package with airtight sealing according to the prior art.
Figure 1M:
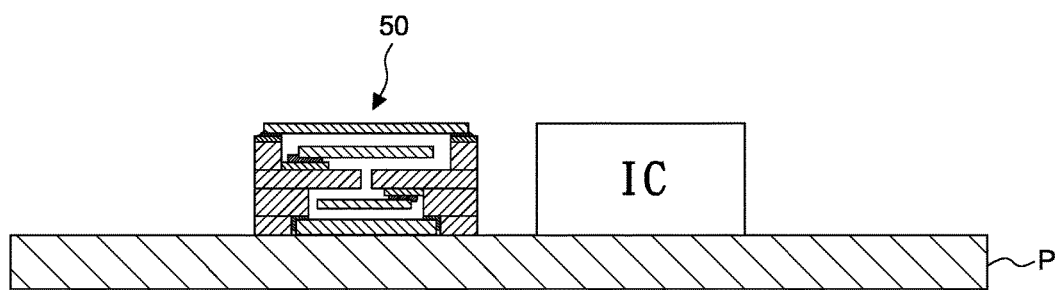
FIG. 1M is a schematic diagram showing the downsized crystal resonator package with airtight sealing mounted on a PCB.
Figure 2:
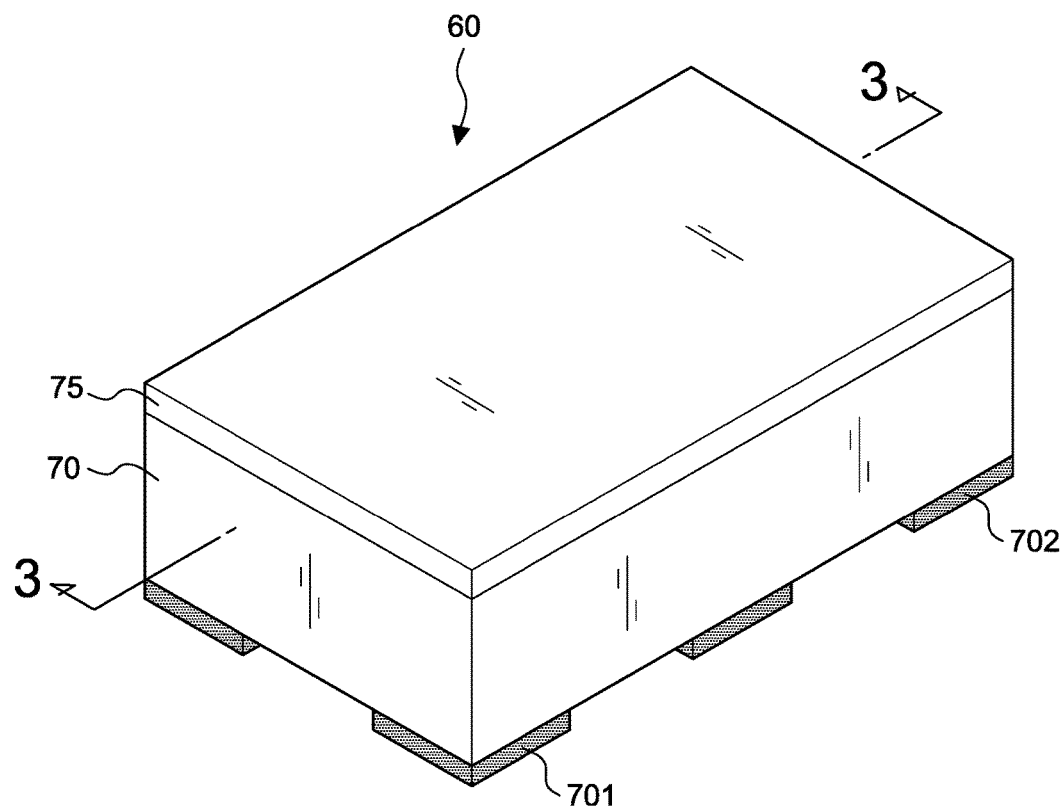
FIG. 2 is a perspective view of the present invention.

| | Item | | | |
|---|---|---|---|---|
| | A Conventional package structure of two crystal resonators (FIGS. 1A-1B) | B Conventional package structure of two crystal oscillators (FIGS. 1C-1F) | C Conventional integrated package of two crystal resonators (FIGS. 1J-1M) | D Integrated package of crystal oscillators (the present invention) |
| Quality factor | Excellent | Excellent | Excellent | Excellent |
| Phase noise control | Poor | Excellent | Poor | Excellent |
| Integration of different clock rates | Fair | Fair | Excellent | Excellent |
| Covering area on a smartphone | Fair | Fair | Less | Less |
| Costs for parts | Fair | High | Low | Fair |

As the control of phase noises is a vital factor in hi-fi system, items A and C are ruled out undoubtedly. The present invention further integrates the crystal oscillators with an ASIC as a package to retain the features of excellent quality of phase noise control to satisfy the requirements of hi-fi systems and meanwhile keep the features of better integration and less covering area on a smartphone, therefore reducing the costs for parts as well.

In short, the present invention integrates the first and second crystal quartz resonators 80A, 80B and the ASIC 90, and keeps the feature of better phase noise control to achieve and satisfy the requirements of hi-fi systems; such structure also consumes lower costs for parts in the manufacturing process.

Although a particular embodiment of the invention has been described in detail for purposes of illustration, various modifications and enhancements may be made without departing from the spirit and scope of the invention. Accordingly, the invention is not to be limited except by the appended claims.

What is claimed is:

1. A structure of an integrated crystal oscillator package, comprising:
    a substrate having a first depression arranged thereon and a second depression arranged at a bottom thereof, said first depression having a first stair surface with a first conductive section and a second stair surface with a second conductive section, and said second depression having a third conductive section;
    a first quartz crystal resonator having an end thereof fixed on the first conductive section;
    a second quartz crystal resonator having an end thereof fixed on the second conductive section;
    a cover disposed on the first depression for sealing the first and second quartz crystal resonators therein; and
    an application-specific integrated circuit chip (ASIC) coupled to the third conductive section, said third conductive section further separately connected to the first and second conductive sections;
    whereby the ASIC has a switch control to switch between audio formats with different degree of hi-fidelity (hi-fi) when receiving them and to operate correspondingly to a first clock rate output from the first quartz crystal resonator or to a second clock rate output from the second quartz crystal resonator.

2. The structure of an integrated crystal oscillator package as claimed in claim 1, wherein frequencies of 44.1 kHz and a multiple thereof are corresponding to the first clock rate, and frequencies of 48 kHz and a multiple thereof are corresponding to the second clock rate.

3. The structure of an integrated crystal oscillator package as claimed in claim 1, wherein the first and second quartz crystal resonators have either the same sides or opposite sides fixed on the first and second conductive sections.

4. The structure of an integrated crystal oscillator package as claimed in claim 1, wherein the substrate is a ceramic substrate or a PCB to have electric wires arranged therein separately connecting the third conductive section with the first and second conductive sections for the switch control to operate.

5. The structure of an integrated crystal oscillator package as claimed in claim 4, wherein the substrate further has a first bond pad group and a second bond pad group at a bottom thereof, said first and second bond pad groups individually coupled to the ASIC via the electric wires for the present invention to form a surface mount device (SMD).

6. The structure of an integrated crystal oscillator package as claimed in claim 1, wherein the switch control has a first switch and a second switch to switch between a first sampling frequency output and a second sampling frequency output and to simultaneously output both frequencies.

7. A structure of an integrated crystal oscillator package, comprising:
    a substrate having a first depression arranged thereon and a second depression arranged at a bottom thereof, said first depression having a first stair surface with a first conductive section and a second stair surface with a second conductive section, and said second depression having a third conductive section;

a first quartz crystal resonator having an end thereof fixed on the first conductive section;

a second quartz crystal resonator having an end thereof fixed on the second conductive section;

a cover disposed on the first depression for sealing the first and second quartz crystal resonators therein; and an application-specific integrated circuit chip (ASIC) coupled to the third conductive section, said third conductive section further separately connected to the first and second conductive sections;

whereby the ASIC has a switch control for operation when receiving audio format of 44.1 kHz and 48 kHz with different degree of hi-fidelity (hi-fi), the 44.1 kHz and a multiple thereof being corresponding to a first clock rate output from the first quartz crystal resonator and the 48 kHz and a multiple thereof being corresponding to a second clock rate output from the second quartz crystal resonator.

8. The structure of an integrated crystal oscillator package as claimed in claim 7, wherein the switch control has a first switch and a second switch to switch between a first sampling frequency output and a second sampling frequency output and to simultaneously output both frequencies.

* * * * *